(12) United States Patent
Tilmans et al.

(10) Patent No.: US 7,372,346 B2
(45) Date of Patent: May 13, 2008

(54) ACOUSTIC RESONATOR

(75) Inventors: Hendrikus A. C. Tilmans, Maastricht (NL); Wanling Pan, Leuven (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 189 days.

(21) Appl. No.: 11/024,165

(22) Filed: Dec. 27, 2004

(65) Prior Publication Data

US 2005/0146401 A1 Jul. 7, 2005

Related U.S. Application Data

(60) Provisional application No. 60/533,322, filed on Dec. 29, 2003.

(30) Foreign Application Priority Data

Dec. 24, 2003 (EP) .................................. 03447311

(51) Int. Cl.
*H03H 9/54* (2006.01)
*H03H 9/15* (2006.01)

(52) U.S. Cl. ........................................ 333/187; 333/188
(58) Field of Classification Search ................ 333/187, 333/188; 310/334

See application file for complete search history.

(56) References Cited

U.S. PATENT DOCUMENTS

| | | | |
|---|---|---|---|
| 5,166,646 A | 11/1992 | Avanic et al. | 331/107 A |
| 5,339,051 A | 8/1994 | Koehler et al. | 331/65 |
| 5,617,065 A | 4/1997 | Dydyk | 333/186 |
| 5,747,857 A | 5/1998 | Eda et al. | 257/416 |
| 6,204,737 B1 * | 3/2001 | Ella | 333/187 |
| 6,236,281 B1 | 5/2001 | Nguyen et al. | 331/154 |
| 6,473,289 B1 | 10/2002 | Weisse et al. | 361/283.1 |
| 6,741,147 B2 * | 5/2004 | Harris | 333/188 |
| 6,788,170 B1 * | 9/2004 | Kaitila et al. | 333/187 |
| 6,809,604 B2 * | 10/2004 | Kawakubo et al. | 331/107 A |

(Continued)

FOREIGN PATENT DOCUMENTS

DE        10153434 A1     5/2003

(Continued)

OTHER PUBLICATIONS

Krishnaswamy et al., "*Film Bulk Acoustic Wave Resonator Technology*", IEEE Ultrasonics Symposium, pp. 529-536 (1990).

(Continued)

*Primary Examiner*—Dean Takaoka
(74) *Attorney, Agent, or Firm*—McDonnell Boehnen Hulbert & Berghoff LLP

(57) ABSTRACT

A tuneable film bulk acoustic resonator (FBAR) device. The FBAR device includes a bottom electrode, a top electrode and a piezoelectric layer in between the bottom electrode and the top electrode. The piezoelectric layer has a first overlap with the bottom electrode, where the first overlap is defined by a projection of the piezoelectric layer onto the bottom electrode in a direction substantially perpendicular to a plane of the bottom electrode. The FBAR device also includes a first dielectric layer in between the piezoelectric layer and the bottom electrode and a mechanism for reversibly varying an internal impedance of the device, so as to tune a resonant frequency of the FBAR device.

20 Claims, 8 Drawing Sheets

U.S. PATENT DOCUMENTS

| | | | |
|---|---|---|---|
| 6,943,484 B2 * | 9/2005 | Clark et al. | 310/334 |
| 7,002,437 B2 * | 2/2006 | Takeuchi et al. | 333/187 |
| 2005/0034822 A1 * | 2/2005 | Kim et al. | 159/5 |

FOREIGN PATENT DOCUMENTS

| | | |
|---|---|---|
| EP | 0631384 A1 | 12/1994 |
| SU | 980252 | 12/1982 |

OTHER PUBLICATIONS

Lutsky et al., "*A Sealed Cavity TFR Process for RF Bandpass Filters*", IEEE IEDM 1995, pp. 95-98 (1996).

K.M. Lakin, "*Thin Film Resonators and Filters*", IEEE Ultrasonics Symposium, pp. 895-906 (1999).

Ballato, *Modeling Piezoelectric and Piezomagneic Devices and Structures via Equivalent Networks,* IEEE Transactions on Ultrasonics, vol. 48, No. 5 pp. 1189-1240 (Sep. 2001).

Ylilammi et al., "*Thin Film Bulk Acoustic Wave Filter*", IEEE Transactions on Ultrasonics, Ferroelectrics, and Frequency Control, vol. 49, No. 4 pp. 535-539 (Apr. 2002).

Lanz et al., "*Surface Micromachined BAW Resonators Based on ALN*" IEEE Ultrasonics Symposium, pp. 981-983 (2002).

Khanna et al., "*A 2GHz Voltage Tunable FBAR Oscillator*", IEEE MTT-S Digest, pp. 717-720 (2003).

Hara et al., " *Aluminum Nitride Based Thin Film Bulk Acoustic Resonator Using Germanium Sacrificial Layer Etching*", IEEE Transducers '03 The 12$^{th}$ International Conference on Solid State Sensors, Actuators and Microsystems, pp. 1780-1783 (Jun. 8, 2003).

European Search Report for EP 03 44 7311, application of Interuniversitair Microelektronica Centrum, dated Jun. 2, 2004.

European Search Report for EP 04 07 8526, application of Interuniversitair Microelektronica Centrum, dated May 6, 2005.

* cited by examiner

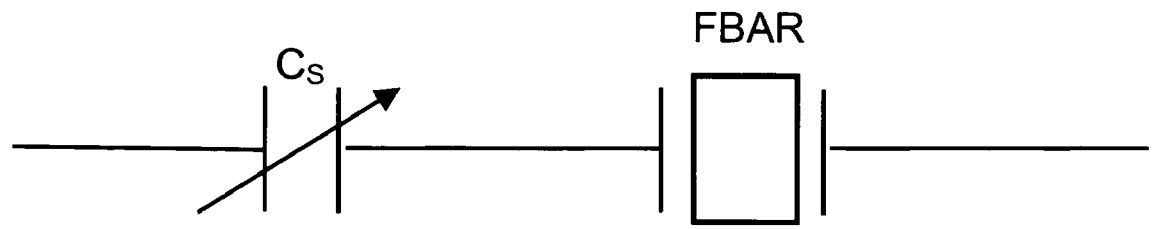
Fig. 2 – PRIOR ART
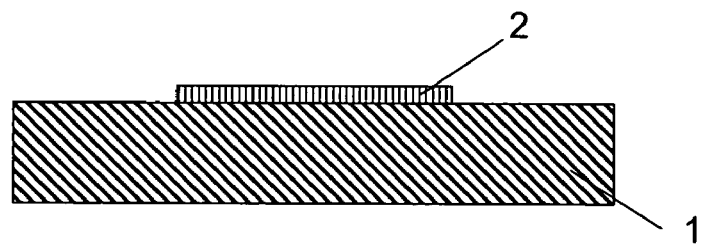
Fig. 3
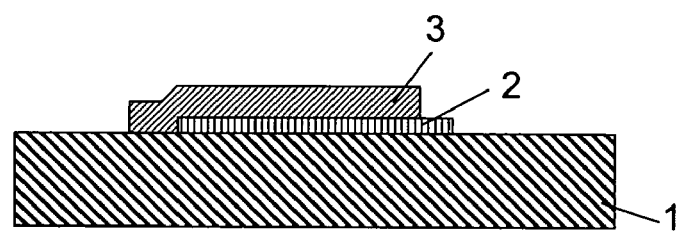
Fig. 4
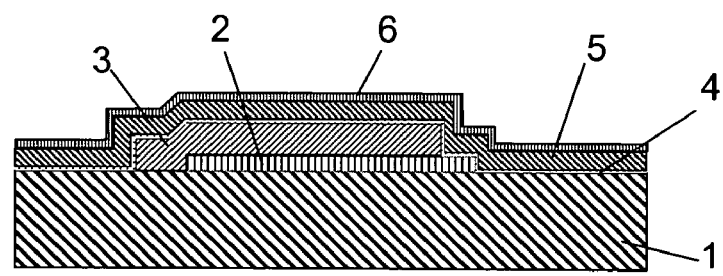
Fig. 5

ACOUSTIC RESONATOR

CROSS REFERENCE TO RELATED APPLICATIONS

This application claims the benefit under 35 U.S.C. § 119(e) of U.S. Provisional Patent Application 60/533,322, filed on Dec. 29, 2003. This application also claims the benefit under 35 U.S.C. § 119(a) of European patent application EP 03447311.6, filed on Dec. 24, 2003. U.S. Provisional Patent Application 60/533,322 and European Patent Application EP 03447311.6 are herein incorporated by reference in their entirety.

BACKGROUND

1. Field

The present invention is related to the field of Micromachined Electro Mechanical Systems (MEMS) and, more particularly to an RF-MEMS film bulk acoustic resonator, a method of making such a resonator and a method of tuning such a resonator.

2. Description of Related Art

Radio Frequency (RF) MEMS devices have a broad range of potential applications in military and commercial wireless communication, navigation and sensor systems. Military applications in the K-W frequency band include RF seekers and ground-based radar systems. Additionally, millimeter wave (MMW) sensors can utilize RF-MEMS devices for components such as antennas (switches and phase shifters), exciters, transmitters, filters and IF/RF receivers.

RF-MEMS devices, though small, can be very complex and may encompass multiple interdependent engineering disciplines. Furthermore, the performance of RF-MEMS devices can be influenced by their environment and packaging. Modeling of these devices is critical to reduce both the time and cost of development of a final RF-MEMS device or integrated RF-MEMS micro-systems.

Film Bulk Acoustic Resonators (FBAR) devices are micromachined frequency control devices that typically operate in the RF frequency range, such as in the range of a few hundred MHz up to tens of GHz. FBARs have received considerable interest in the RF microelectronics industry because of their applications in oscillators and filter design. A particular interest in FBARs has developed in the area of wireless telecommunication systems, such as mobile phones, WLAN or satellite communications. FBARs have already experienced substantial acceptance in the personal communications services (PCS) market.

The working principle of an FBAR is as follows. An alternating voltage is applied over a thin film layer of a piezoelectric material such as AlN or ZnO that is sandwiched between two electrodes, which may be, for example, metal electrodes (see FIG. 1A). This piezoelectric layer expands and contracts as a result of this applied voltage and an acoustic wave is generated. At a certain frequency, the polarization factor of the piezoelectric layer will be in-phase with the applied electric field. The frequency at which this occurs is defined as the resonant frequency of the FBAR. The resonant frequency mainly depends on the thickness of the piezoelectric layer. To reduce acoustic loss and loading effects, the sandwiched structure is normally suspended in air, or is mounted on reflection layers, which reflect back the traveling acoustic wave in the interface. A corresponding electrical configuration (schematic) of a prior art FBAR is shown in FIG. 1B.

FBARs have the advantages of small size and a high quality factor, and can be used to build filters with low insertion loss and steep roll-off/on performance. Insertion loss is an indication of loss in transmission. The steepness of roll-off/on is an indication of how 'sharp' the resonant peak is and is also an indicator of the precision and effectiveness of frequency control. FBARs have the further advantage of having moderate temperature coefficients (TCs) and good power-handling capability. These characteristics make FBARs attractive for a wide range of applications.

Both bulk and surface micromachined FBARs have been realized. Bulk FBARs are described in more detail in S. V. Krishnaswamy et al. "Film Bulk Acoustic Wave Resonator Technology" 1990 IEEE Ultrasonics Symposium, pp 529-536; J. J. Lutsky et al. "A Sealed Cavity TFR Process for RF Bandpass Filters" IEDM'96; K. M. Lakin "Thin Film Resonators and Filters" 1999 IEEE Ultrasonics Symposium pp. 895-906; and Markku Ylilammi et al. "Thin Film Bulk Acoustic Wave Filter", IEEE Transactions on UFFC, Vol. 49. No. 4. April 2002, pp. 535-539. Surface FBARs are described in more detail in R. Lanz et al. "Surface Micromachined BAW Resonators Based on AlN" 2002 IEEE Ultrasonics Symposium, pp. 981-983; and Motoaki Hara et al. "Aluminum Nitride Based Thin Film Bulk Acoustic Resonator Using Germanium Sacrificial Layer Etching" The 12th International Conference on Solid State Sensors, Actuators and Microsystems, Boston, Jun. 8-12, 2003.

The resonant frequency of an FBAR is subject to influence or variation from, for example, electromagnetic interference, temperature changes, aging effects, etc. To compensate for performance drifts of different origins and for in-homogeneity resulting from the fabrication process, a degree of tuning in FBARs is desirable. Different tuning solutions currently exist in the art. However, for various reasons, these tuning solutions produce low Quality factors, are not well integrated with the FBAR device and/or have unacceptable tuning ranges.

SUMMARY

Resonant frequency tunable FBAR devices are disclosed that have high Quality factors and a high degree of tunability with respect to currently existing FBARs. Such devices allow for providing FBAR devices with an integrated frequency tuning mechanism. Such devices also allow for providing small size tunable FBAR devices, which can easily undergo wafer level packaging. Further, the devices disclosed herein allow for providing an FBAR device with improved acoustic isolation.

In a first embodiment, an FBAR device includes a mechanism for internally varying an impedance of the device, such as a capacitance. The FBAR device comprises a bottom electrode, a top electrode and a piezoelectric layer in between the bottom electrode and the top electrode. The piezoelectric layer has a first overlap with the bottom electrode, the first overlap being defined as the projection of the piezoelectric layer onto the bottom electrode in a direction that is substantially perpendicular to the plane of the bottom electrode. The device further includes a dielectric layer in between the piezoelectric layer and the bottom electrode. A mechanism for altering an internal impedance of the device can be provided for tuning the resonant frequency. This mechanism may alter a relative position of components of the device, change a dimension of the device or move a material that has a dielectric constant greater than 1 into or out of a part of the device in which there is an electric field. This material may be a constituting element in the form of a solid piece or block of material which can be controllably moved.

In another embodiment, an FBAR device may also comprise a dielectric layer in between the piezoelectric layer and the top electrode. The piezoelectric layer may have a second overlap with the top electrode, the second overlap being defined as the projection of the piezoelectric layer onto the top electrode in a direction substantially perpendicular to the plane of the top electrode.

In certain embodiments, the dielectric layer may comprise a gas such as air or a space under vacuum. In other embodiments, the bottom electrode may comprise a first material and the top electrode may comprise a second material. The first and the second materials may either be the same material or may be different materials. For example, the first material may be a first metal and the second material may be a second metal, where the first metal and the second metal are different from each other.

The FBAR devices disclosed herein may have Quality factors higher than a few hundred and even higher than a few thousand. Furthermore, these devices may have a relative tuning range of between 0.5% and 3%, where the relative tuning range may depend on the material used for the piezoelectric layer.

Another example embodiment of an FBAR device includes a bottom electrode and a top electrode, a piezoelectric layer in between the bottom electrode and the top electrode. The piezoelectric layer has a first overlap with the bottom electrode, the first overlap being defined as the projection of the piezoelectric layer onto the bottom electrode in a direction substantially perpendicular to the bottom electrode. This FBAR device may further comprise a dielectric layer in between the piezoelectric layer and the bottom electrode. The resonant frequency of the FBAR device may be tuned by varying an internal impedance of the device. The change in impedance may be achieved by a variety of methods, e.g., the resonant frequency can be tuned by varying the first overlap between the piezoelectric layer and the bottom electrode and/or by varying the thickness $t_1$ of the first dielectric layer, and/or by elastically moving a cantilever beam comprising the piezoelectric layer and/or by introducing a material with a dielectric constant greater than 1. Varying the first overlap may be performed by moving the piezoelectric layer in a horizontal direction with respect to the bottom electrode, e.g., in a direction substantially parallel with the plane of the bottom electrode. Varying the thickness of the dielectric layer may be performed by moving the top electrode, and hence the piezoelectric layer, in a vertical direction with respect to the bottom electrode, e.g., in a direction substantially perpendicular to the plane of the bottom electrode.

In another embodiment, an FBAR includes a dielectric layer with a thickness $t_2$ in between the piezoelectric layer and the top electrode and the piezoelectric layer having a second overlap with the top electrode, the second overlap being defined as the projection of the piezoelectric layer onto the top electrode in a direction substantially perpendicular to the plane of the top electrode. Tuning of the resonant frequency may then be achieved by varying the second overlap, the thickness $t_2$, the thickness $t_1$ and/or the first overlap.

Different actuation mechanisms may be used in order to effect movement of the elements of such FBAR device, particularly electrodes and piezoelectric layers. Such actuation mechanisms include electrothermal, electromagnetic, electrodynamic, electrostatic, piezoelectric, shape memory and magneto-restrictive actuation mechanisms.

A method for manufacturing an FBAR device includes forming a first planar conductive layer on a substrate, forming a sacrificial layer on the first conductive layer and forming a piezoelectric layer on the sacrificial layer. The piezoelectric layer has a first overlap with the first conductive layer, where the first overlap is defined as the projection of the piezoelectric layer onto the first conductive layer electrode in a direction substantially perpendicular to the first planar conductive layer. The method further includes forming a second conductive layer on the piezoelectric layer and removing the sacrificial layer to form a dielectric layer in between the piezoelectric layer and the first planar conductive layer.

One advantage of such embodiments as compared with current approaches is that tuning the resonant frequency in such devices may be reversible. This means tuning may be performed in both upward and downward directions and is not fixed once tuning has been performed.

These and other aspects will become apparent to those of ordinary skill in the art by reading the following detailed description, with reference, where appropriate, to the accompanying drawings. Further, it should be understood that the embodiments noted in this summary are only examples and not intended to limit the scope of the invention as claimed.

BRIEF DESCRIPTION OF THE DRAWINGS

Example embodiments of the present invention are described herein with reference to the drawings. The drawings described are only schematic and are non-limiting. In the drawings, the size of some of the elements may be exaggerated and not drawn on scale for illustrative purposes, in which:

FIG. 1A is an isometric view of a prior art FBAR, FIG. 1B is a schematic of the electrical equivalent of the FBAR of FIG. 1A, FIG. 1c is a schematic that illustrates an FBAR filter and FIG. 1D is a graph of FBAR impedance versus signal frequency for the filter of FIG. 1C;

FIG. 2 is a schematic diagram of a prior art circuit including a variable capacitor tuning FBAR device is shown;

FIGS. 3-9 are drawings illustrating a processing sequence in accordance with an embodiment of the invention;

DETAILED DESCRIPTION

Overview

Figure 1A:
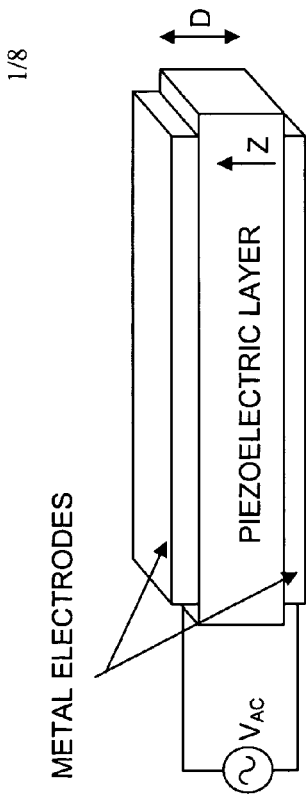
FIGS. 1A-1D are drawings that illustrate prior art FBARs, where
Figure 1B:
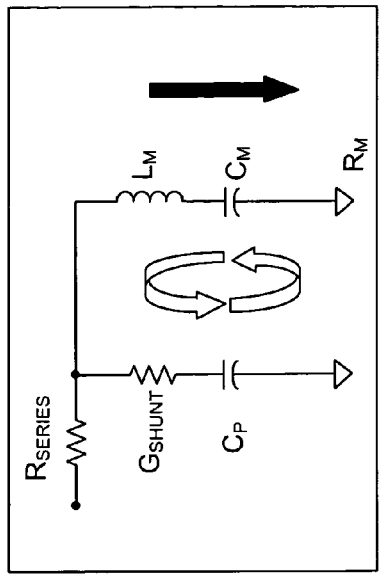
Figure 1D:
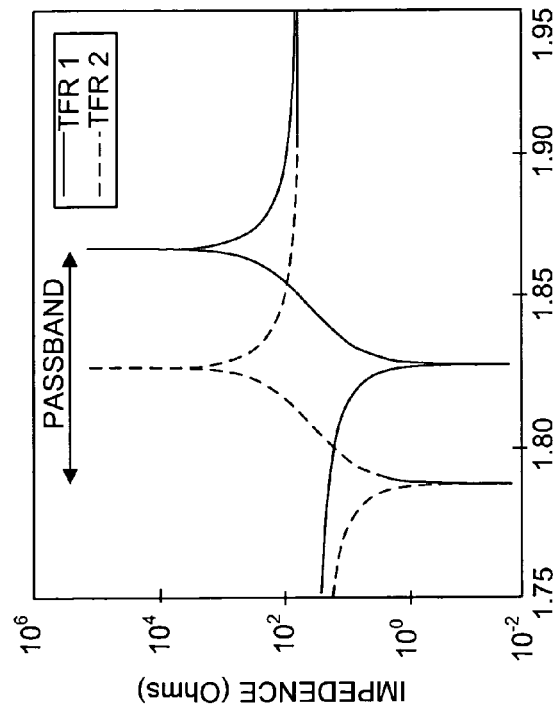
Figure 1C:
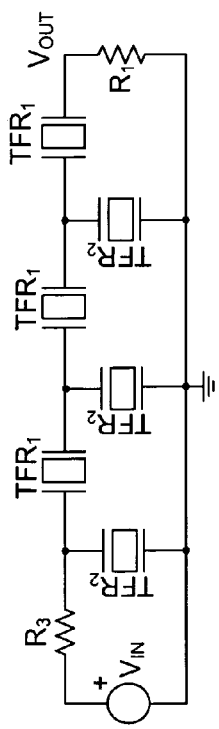

Embodiments of film bulk acoustic resonator (FBAR) devices are described herein, which work in the RF frequency range (e.g., in the range of a few hundred MHz up to tens of GHz). It will be appreciated that in the embodiments described herein, surface acoustic waves are set up in the piezoelectric material to form a resonating device.

In an example embodiment of an FBAR device, the device includes a mechanism for varying an internal impedance of the device. Correspondingly, a method for tuning an FBAR device includes internally tuning the resonant frequency of the FBAR device. The mechanism for altering an internal impedance of the device can be a mechanism for altering an internal capacitance of the device, however, the invention is not so limited. Alternatively, the mechanism for altering an internal impedance of the device can be a mechanism for altering an internal inductance of the device.

The mechanism for altering an internal impedance of the device may be a mechanism for altering a relative position of components of the device, for changing a dimension of the device and/or for moving a material having a dielectric constant greater than 1 into or out of a part of the device in which there is an electric field. This material may be a constituting element in the form of a solid piece or block of material which can be controllably moved. In other embodiments, an FBAR device includes a mechanism for automatically compensating for temperature changes, e.g. by using a bimetallic element which is associated with the mechanism for altering the internal impedance and an FBAR device.

Techniques for driving an FBAR device are known. Therefore, for the purposes of brevity and clarity, components for driving an FBAR device are not described in detail herein.

Embodiment for Processing an FBAR Device

Embodiments for processing a tunable FBAR device may include different methods, techniques and sequences. One such process for manufacturing an FBAR device 20 is illustrated in FIGS. 3-9. It will be appreciated that this sequence is not limiting to the invention and that other sequences of process steps may be used to manufacture the FBAR device 20.

In the sequence of FIGS. 3-9, as is shown in FIG. 3, a substrate 1 is provided. The substrate may take the form of any appropriate underlying material or materials upon which a device, a circuit or an epitaxial layer may be formed. In certain embodiments, the substrate 1 takes the form of a semiconductor substrate such as, for example, high-resistivity silicon, doped silicon, gallium arsenide (GaAs), gallium arsenide phosphide (GaAsP), indium phosphide (InP), germanium (Ge), or silicon germanium (SiGe). The substrate 1 may include, for example, an insulating layer such as a $SiO_2$ or a $Si_3N_4$ layer in addition to a semiconductor substrate portion. Thus, the substrate 1 may take the form of a silicon-on-glass substrate or a silicon-on sapphire substrate. The substrate 1 is, therefore, a base on which other layers are formed, such as the layers of an FBAR.

A first conductive layer is deposited on top of the substrate 1. The first conductive layer may be, for example, a metal layer (e.g., copper, gold), an inorganic conductive layer (e.g. indium tin oxide (ITO)), a conductive polymer layer (polyaniline doped with camphor sulfonic acid (PANI/CSA)), or any other suitable conductive layer. The first conductive layer is patterned by, for example, photolithography to form a bottom electrode 2, as is shown in FIG. 3.

The photolithography process comprises the following steps. First, a photoresist layer is applied on top of the first conductive layer, such as by spin-coating. The photoresist layer may have a thickness of a few μm and may take the form of any suitable polymer that can be used as a photoresist, such as for example poly (vinyl cinnamate) or novolak-based polymers. Thereafter, a mask is applied to align a pattern onto the photoresist. The photoresist layer is then illuminated through the mask (e.g., using ultraviolet (UV) light) to expose the pattern in the photoresist. After exposure, the photoresist is developed, where either the illuminated parts of the photoresist (positive resist) or the non-illuminated parts of the photoresist (negative resist) are removed, depending on the type of photoresist used. Patterning of the first conductive layer is then performed using the developed photoresist layer as a mask to form the bottom electrode 2. After formation of the bottom electrode 2, the remaining parts of the photoresist layer are removed, typically using an organic solvent.

As is shown in FIG. 4, a sacrificial layer 3 is then deposited on top of the substrate 1 and the bottom electrode 2. The sacrificial layer 3 may be any suitable material that may be used as a sacrificial material such as, for example, a photoresist, $SiO_2$ or polyimide. The thickness of the sacrificial layer 3 will later determine the height of an airgap in the final FBAR device and may range from several μm down to 500 nm. In this embodiment, the sacrificial layer 3 is then patterned by photolithography. The result after patterning is illustrated in FIG. 4.

An etch stop layer 4, a piezoelectric layer 5 and a second conductive layer 6 are then deposited, as is shown in FIG. 5. The piezoelectric material of the layer 5 may be any appropriate piezoelectric material. For example, the piezoelectric material may be aluminum nitride (AlN). AlN may be grown on a seed layer, such as, for example, Al or Pt, or any other suitable seed layer. The second conductive layer 6, which, after patterning, will result in a top electrode 7, may be a metal layer (e.g. copper, gold), an inorganic conductive layer (e.g. indium tin oxide (ITO)), a conductive polymer layer (polyaniline doped with camphor sulfonic acid (PANI/CSA)) or any other suitable conductive layer. The second conductive layer 6, and hence the top electrode 7, may either be formed of the same material or, alternatively, of a different material than the bottom electrode 2.

Figure 6:
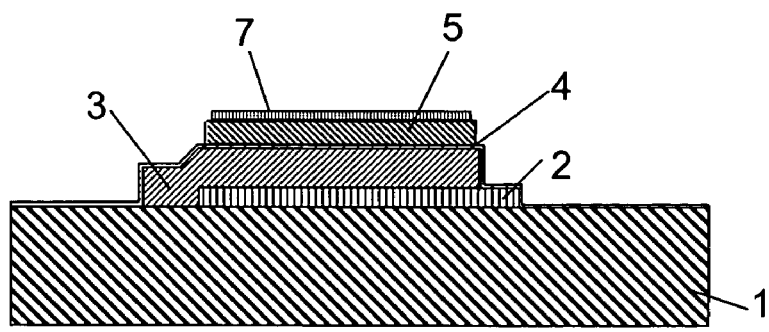

The piezoelectric layer 5 and the second conductive layer 6 may then be patterned using photolithography. The results of such patterning are shown in FIG. 6. The etch stop layer 4 may prevent etching of the sacrificial layer 3 by the solvents/etchants used during patterning of the piezoelectric layer 5. However, if the solvents/etchants used during patterning of the piezoelectric layer 5 are such that they do not affect the sacrificial layer 3, no etch stop layer 4 may be eliminated.

Figure 7:
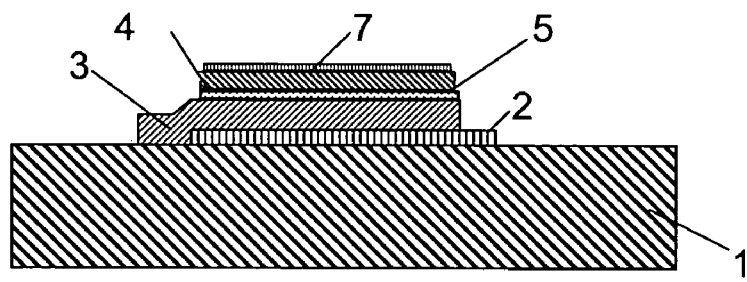

In a further step (where the etch stop layer 4 is employed), the etch stop layer 4 may be removed (see FIG. 7). This may be done by, for example, selective etching. In a specific example, the etch stop layer 4 may be formed out of copper, while the electrodes are for example made of Ta, Ti or any other suitable material. The etch stop layer 4 may then be removed by a selective etching solution that will only etch the copper layer and not the Ta or Ti layer.

A third conductive layer may then be deposited. Deposition of this layer may be accomplished using any suitable technique, such as chemical vapor deposition (CVD) or any other appropriate technique. The third conductive layer may be a metal layer, such as copper or aluminum, but may also be any other suitable conductive layer. The third conductive layer is then patterned to form signal lines 8, as is shown in FIG. 8.

Figure 8:
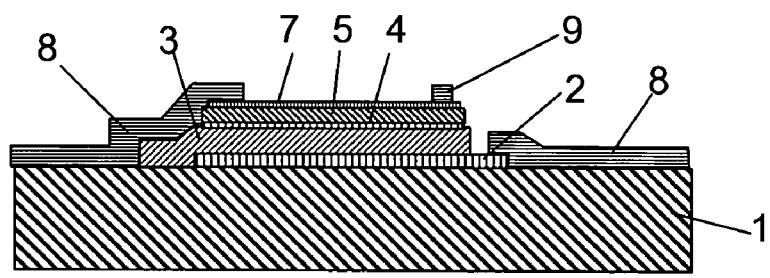
Figure 9:
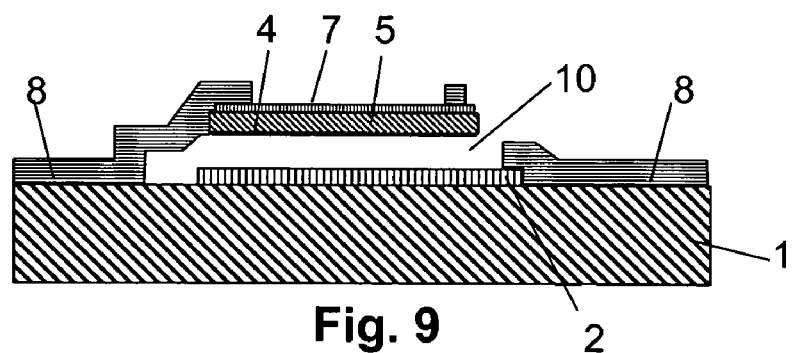

In yet another step, a restraining bridge 9 may be formed, which is also shown in FIG. 8. This bridge may be formed by deposition and subsequent patterning of, for example, an Al layer. The restraining bridge 9 may be used for mechanical support and/or stability of the structure of the FBAR device 20. In certain embodiments the restraining bridge 9 may be eliminated.

In this embodiment, the sacrificial layer 3 is then etched using selective etching. For example, oxygen plasma may be used to etch a photoresist sacrificial layer or a vapor HF etch may be used to etch a $SiO_2$ sacrificial layer. Etching of the sacrificial layer 3 is performed to create an airgap 10 between the bottom electrode 2 and the piezoelectric layer 5. This etching releases the FBAR structure. As was discussed above, the height of the airgap 10 may be determined by the thickness of the sacrificial layer 3 and may be up to several μm, or may be approximately 500 nm. Optionally, the airgap 10 may be filled with a gas other than air or may be placed under vacuum. Independently of whether the gap is filled with a gas or not, the layer will be referred to herein as a dielectric layer.

Tunable FBAR Devices

Figure 10:
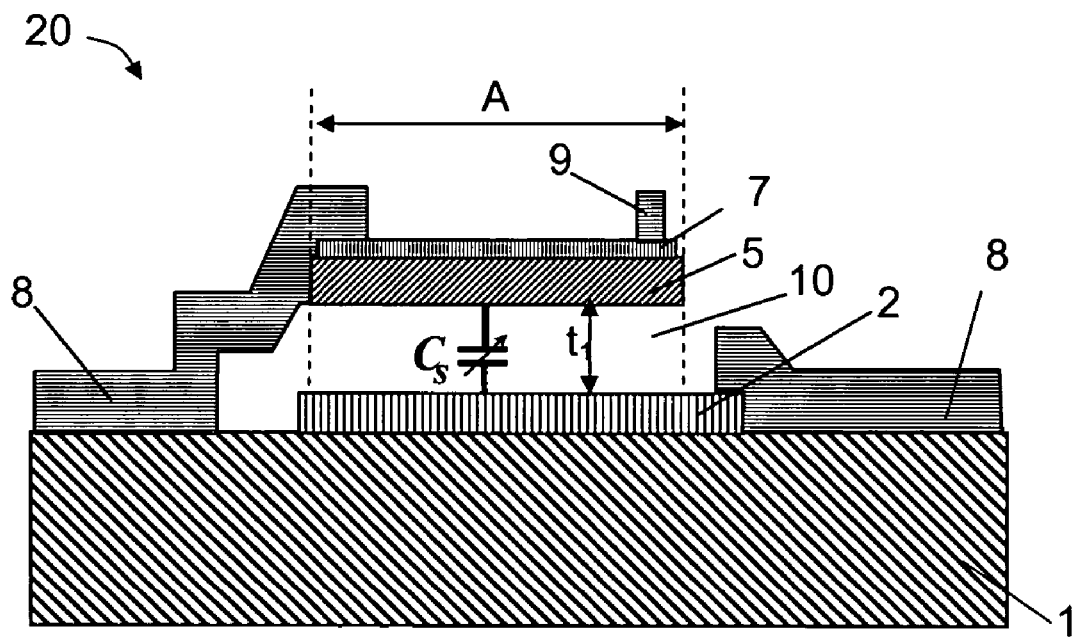
FIGS. 10 and 11 are drawings illustrating, respectively a side view and a top view of an FBAR device according to an embodiment of the invention.
Figure 11:
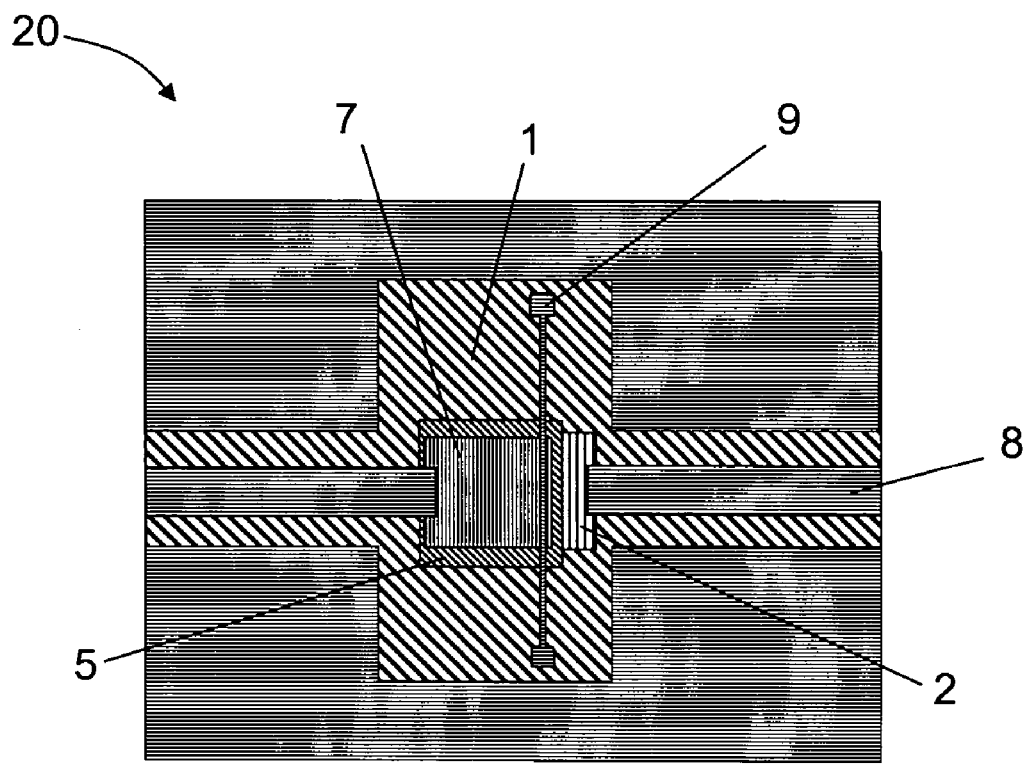

An FBAR device 20 produced by the process sequence illustrated in FIGS. 3-9 is shown in a side view in FIG. 10 and in a top view in FIG. 11. As shown in FIG. 10, a cantilever structure is formed by the piezoelectric layer 5, the top electrode 7, the restraining bridge 9 and the signal line 8. In this embodiment, actuation or tuning of the resonant frequency may be performed by changing a dimension of the device, in particular changing the height of the airgap 10 spacing $t_1$. This technique also provides for tuning by changing the relative position of the components of the device. This may be accomplished by a vertical movement of the cantilever structure, such as movement of the cantilever structure in a direction substantially perpendicular to the plane of the bottom electrode 2. This vertical movement may be achieved by different actuation mechanisms known to those skilled in this area and include electrothermal, electromagnetic, electrodynamic, electrostatic, piezoelectric, shape memory and magneto-restrictive actuation. Such actuators are described, for instance, in "The Mechatronics Handbook", CRC Press, 2002, Chapter 20 § 5.

Figure 12:
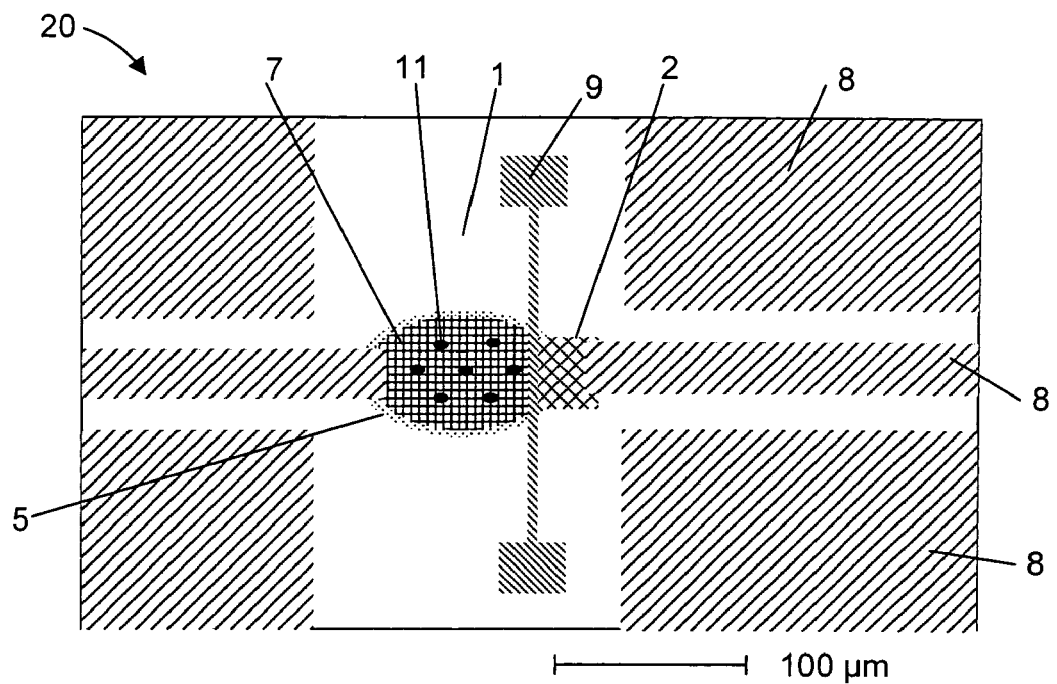
FIG. 12 is an enhanced SEM image of an FBAR device according to an embodiment of the invention.

FIG. 12 is an enhanced SEM image of the FBAR device 20 according to the embodiment described above. On the FBAR plate, which includes the piezoelectric layer 5 and the top electrode 7, holes 11 are formed. The holes 11 facilitate the release of the sacrificial layer 3 during its removal. In an embodiment of an FBAR device, such as the FBAR device 20, the material of the bottom electrode 2 may take the form of a first metal and the material on the top electrode 7 may take the form of a second metal, where the first and second metals are different from each other and are chosen such that an automatic compensation for temperature dependency may be realized in the FBAR device 20.

Figure 13:
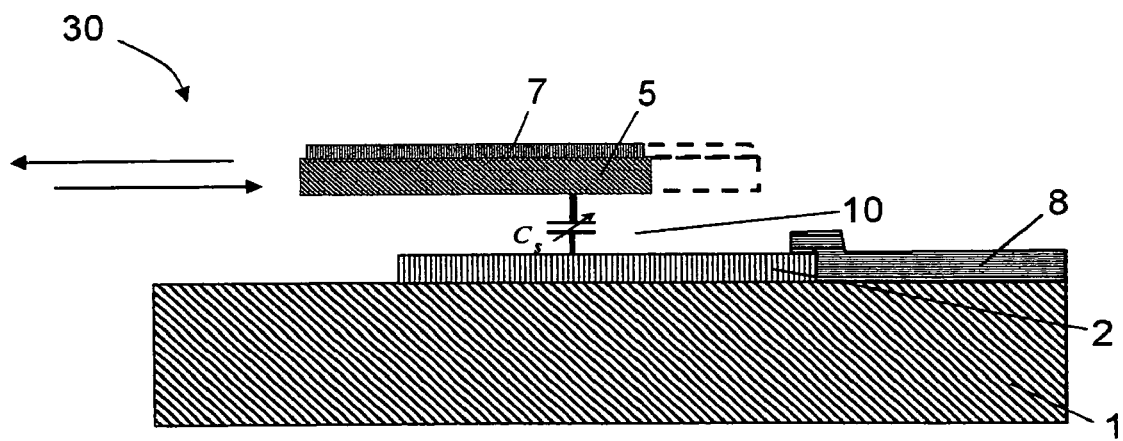
FIGS. 13 and 14 are drawings illustrating, respectively, a side view and a top view of another FBAR device according to an embodiment of the present invention.
Figure 14:
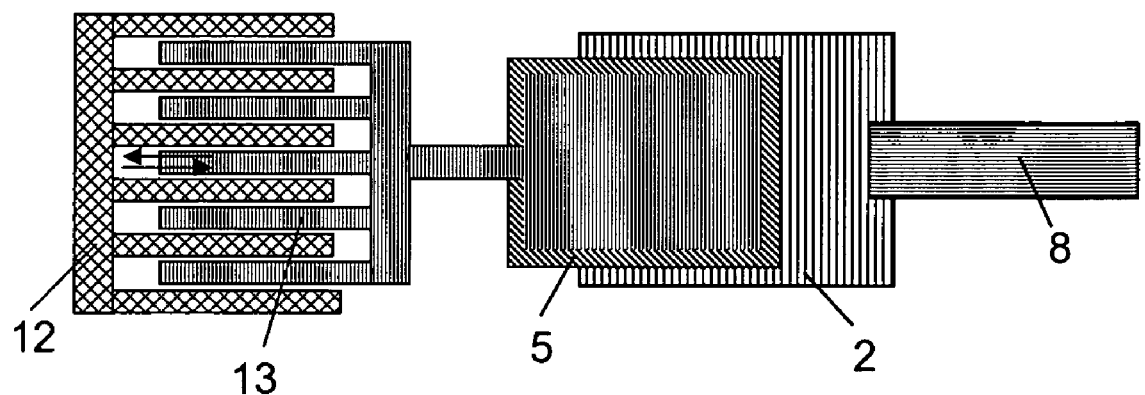

FIG. 13 illustrates a side view and FIG. 14 illustrates a top view of another embodiment of a tunable FBAR device 30. In this embodiment, tuning of the resonant frequency is performed by changing the overlap area A, which is the overlap between the bottom electrode 2 and the piezoelectric layer 5. The overlap area A is defined by projection of the piezoelectric layer 5 onto the bottom electrode 2 in a direction substantially perpendicular to the plane of the bottom electrode 2. This may be achieved by horizontal movement of the cantilever structure, for example, movement of the cantilever structure in a direction substantially parallel to the plane of the bottom electrode 2. The FBAR device 30 further includes a fixed comb 12 and a laterally movable comb 13 that electrostatically interact and laterally move the piezoelectric layer 5, thus reducing the overlap area A. Thus, in this embodiment, the position of the piezoelectric layer 5 determines the area of the tuning capacitor. Different actuation mechanisms may be used in order to move the elements of the FBAR, as has been previously described.

Figure 15:
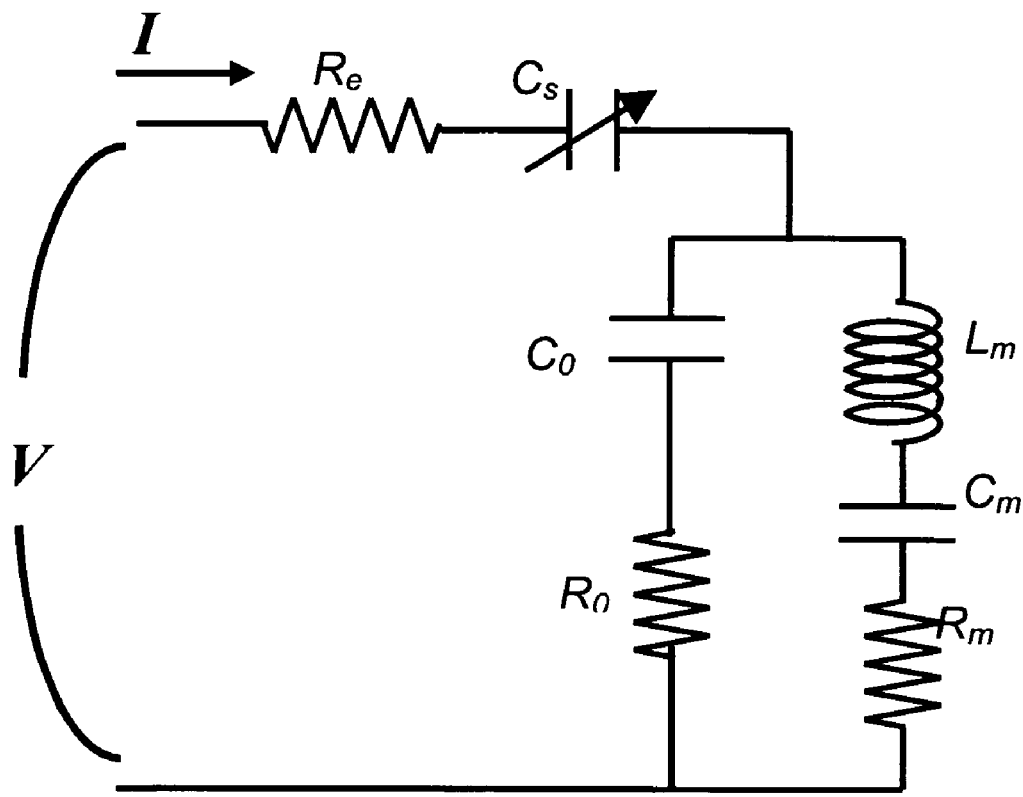
FIG. 15 is a schematic diagram illustrating an equivalent electrical structure for a FBAR device according to an embodiment of the present invention.

FIG. 15 is a schematic diagram that illustrates an equivalent electronic circuit for the FBAR devices 20 and 30. In FIG. 15, the electrical equivalents of the acoustic (resonating) part of the FBAR are represented by $L_m$, $C_m$ and $R_m$. The acoustic part of the FBAR device determines the series resonant frequency of the circuit, if no tuning is applied. $C_0$ represents the capacitance of the piezoelectric layer 5, $R_0$ the electrical loss in the piezoelectric layer 5, $C_s$ the tuning element $R_e$ the electrical resistance (parasitics, etc) in the circuit. The tuning element may be described as:

$$C_s = cst \cdot \frac{A}{t_i} \qquad (1)$$

When an actuating force is applied to the cantilever structure, the cantilever structure, including the piezoelectric layer 5, moves in a vertical direction (first described embodiment) or in a horizontal direction (second described embodiment) with respect to the plane of the bottom electrode 2.

The resonant frequency $\omega_r$ of the device 20, 30 according to the invention may be given by:

$$\omega_r = \sqrt{1 + \frac{C_m}{C_s + C_0}} \, \omega_0 \qquad (2)$$

where $w_0$ is the resonant frequency of the piezoelectric structure if no tuning or actuation exists. $\omega_o$ may be given by:

$$\omega_0 = \frac{1}{\sqrt{L_m C_m}} \qquad (3)$$

By moving the cantilever structure, the capacitance of the air-gap $C_s$ changes and, according to equation (2) above, the resonant frequency of the FBAR device 20 or 30 also changes.

Tuning an FBAR device using electric-field stress or electromechanical stress results in only a small shift in frequency. Thermal tuning requires large power consumption and such devices are difficult to fabricate, as such an approach would require the inclusion of a mechanism for heating and cooling. Such approaches consume a relatively large amount of power and have significantly increased design complexity.

A conventional electrical tuning method would introduce extra loss and parasitic effects because a separate element would need to be added. The FBAR devices 20 and 30 described above included the tuning element as an integrated part of the FBAR devices 20 and 30. Such an approach allows the tuning element to not only serve a tuning function, but also to provide acoustic isolation and may improve the overall Quality factor of the FBAR devices 20 and 30 by at least an order of magnitude. The Quality factor is determined by the material properties and the parasitics. The Q factor of a resonant device may be defined by:

$$Q = 2\pi \left( \frac{\text{maximum energy stored}}{\text{energy loss per cycle}} \right) \quad (4)$$

Since the energy loss per cycle is equal to the (average power dissipated) times (periodic time) and:

$$Q = 2\pi f_r \left( \frac{\text{maximum energy stored}}{\text{average power dissipated}} \right) \quad (5)$$

where $f_r$ is the resonant frequency.

Figure 16:
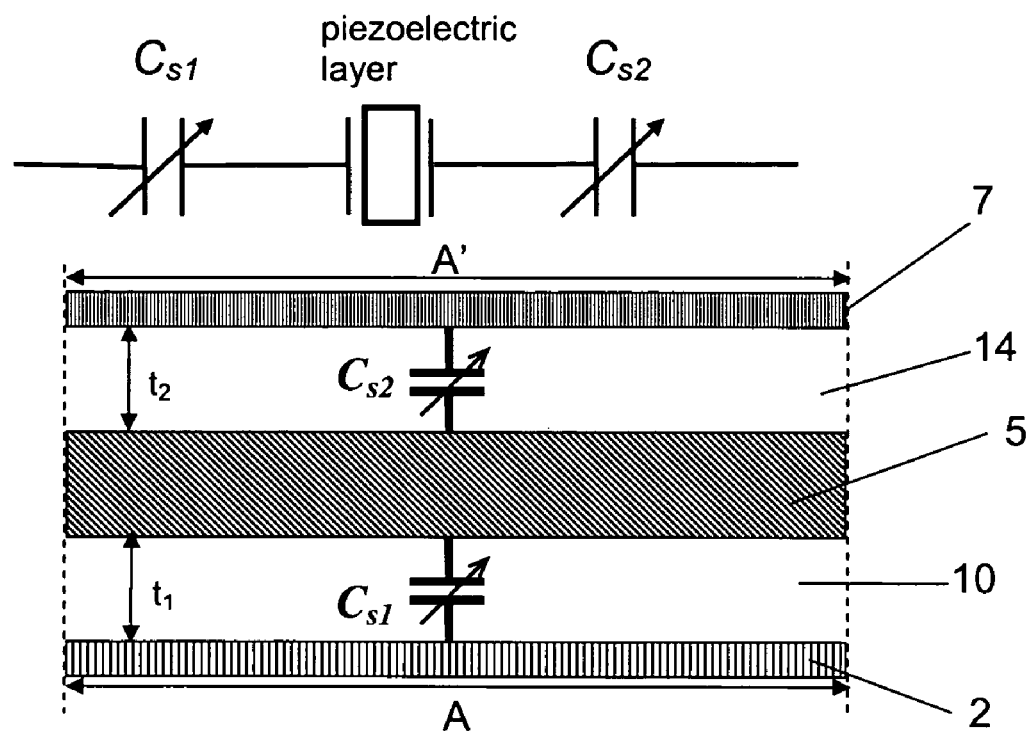
FIG. 16 is a drawing that illustrates part of an FBAR device according to an embodiment of the present invention.

In another embodiment of an FBAR device, the piezoelectric layer 5 is not in contact with the electrodes 2 and 7. Such an embodiment is illustrated in FIG. 16. The device of this embodiment may be called a dual gap device. As is shown in FIG. 16, the piezoelectric layer 5 is not in contact with either of the electrodes 2 or 7, and gaps 10 and 14 are formed between the piezoelectric layer 5 and, respectively the bottom electrode 2 (thickness $t_1$) and between the top electrode 7 (thickness $t_2$). Since the electrodes 2 and 7 are not in the acoustic path of the FBAR device of FIG. 16, it is possible for such a device to achieve a very high Q factor. The value of the Q factor is mainly limited by the material loss of the piezoelectric layer 5, (See, e.g., Joel F. Rosenbaum "Bulk Acoustic Wave Theory and Devices", Artech House, 1988, ISBN 0-89006-265-X).

In this embodiment, the piezoelectric layer 5 has an overlap A with the bottom electrode 2 and an overlap A' with the top electrode 7. The frequency of the FBAR device may be tuned by moving either one or both of the electrodes 2 or 7, or by moving the piezoelectric layer 5 in a vertical and/or horizontal direction with respect to the plane of the bottom electrode 2. In such an approach, the overlap A and/or the overlap A' and/or the thicknesses of the air gaps 10 and 14 (the thicknesses $t_1$ and $t_2$) of the dielectric layers 10 and 14 may be changed in order to achieve tuning of the FBAR device. By moving the piezoelectric layer 5 in a horizontal or a vertical direction, both airgaps 10 and 14 may be varied. Moving the piezoelectric layer 5 results in an embodiment in which a material with a dielectric constant greater than 1 is moved in or out of a part of the device where there is an electric field. The equivalent tuning capacitor value may be given by:

$$C_S = \frac{C_{S1} C_{S2}}{C_{S1} + C_{S2}} \quad (6)$$

In such an FBAR device, the frequency tuning device or element is integrated into the FBAR instead of being implemented as a discrete external component. Furthermore, the tuning element may function as an acoustic isolator. Such a device enables providing a high Quality factor. The Quality factor may be higher than a few hundred and higher than a few thousand, depending on the particular arrangement. Such Quality factors are achievable due, in large part, to the elimination of the contact between bottom electrode 2 and the piezoelectric layer 5 in a conventional sandwiched structure, the elimination of interconnections in the case of a discretely-coupled conventional approach and the elimination of the piezoelectric layer 5 being in contact with the electrodes at all.

Airgap 10 tuning of the FBAR devices 20 and 30 may be performed by state-of-the art actuation methods as previously described. Further, the tuning methods described herein are reversible. This means that tuning of the resonant frequency is not permanent. After tuning the resonant frequency, the resonant frequency may again be tuned toward both higher and/or lower frequencies.

The FBAR devices described above allow for low power consumption as compared with thermal tuning and offer real-time tunability. Further, the FBAR devices 20 and 30 allow for a relative tuning compensation of between 1 and 3%, whereas in the prior art only relative compensation of 0.1% may be achieved. Such embodiments may be produced with state-of-the-art surface micromachining techniques.

Another tuning mechanism that may be implemented in the first or third FBAR device embodiments described above is post-pull-in tuning. This may be accomplished when part of the movable structure is in its post-pull-in state and is touching the substrate. When the pull-in state is reached, it may still be possible to change the frequency of the FBAR device if only part of the piezoelectric cantilever is touching the bottom electrode 2. However, such a change is really hard to precisely predict. Further, devices according to the first and third embodiments described above may function as switchable FBAR devices (may be switched from ante- to post-pull-in) where the resonant frequency of the device has a sharp transition before and after pull-in happens.

In yet another embodiment of a tunable FBAR device, a material with a dielectric constant greater than 1 is moved in or out of a part of the device where there is an electric field. This material may be a constituting element in the form of a solid piece or block of material which can be controllably moved. In such an embodiment the material is moved in or out of either or both of the air gaps 10 and 14. The material has a dielectric constant of greater than 1 and, therefore, influences the capacitance $C_{s_1}$ and/or $C_{s_2}$ to thereby tune the resonant frequency. Different actuation mechanisms may be used in order to move the elements of the FBAR device, as have been previously described.

The embodiments of FBAR devices described above may be constructed such that they automatically compensate for temperature changes, e.g. by using a bimetallic element which is associated with the mechanism for altering the internal impedance. For example, the piezoelectric layer 5 and the top electrode 7 can differ in thermal expansion coefficients. This may result in the top electrode 7 moving closer to or further away from the bottom electrode 2 as the temperature changes. This effect may be used to compensate for changes in the resonant frequency with temperature. To assist in this compensation, the top electrode 7 may be made of two differing metals which act as a bimetallic strip. Changes in temperature will cause the bi-metallic strip (the top electrode 7) to move up or down with respect to the bottom electrode 2. Careful choice of materials and thickness can be used to compensate for any changes in resonant frequency caused by changes in temperature.

Figure 17:
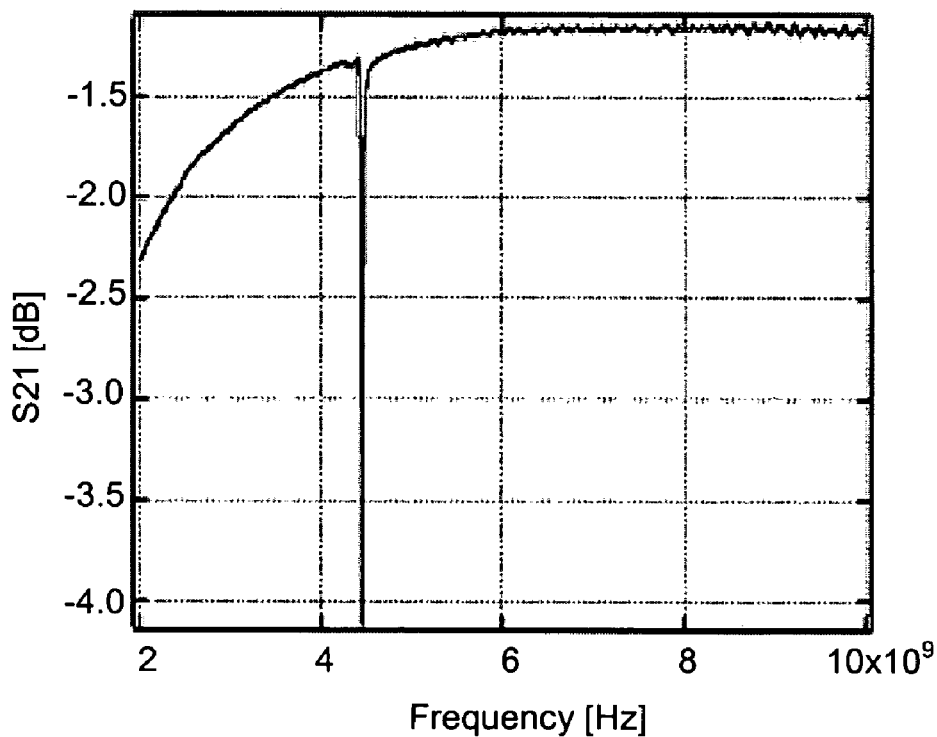
FIGS. 17 and 18 are graphs that illustrate, respectively, S21 and S11 functions as a function of signal frequencies for an FBAR device according to an embodiment of the invention.
Figure 18:
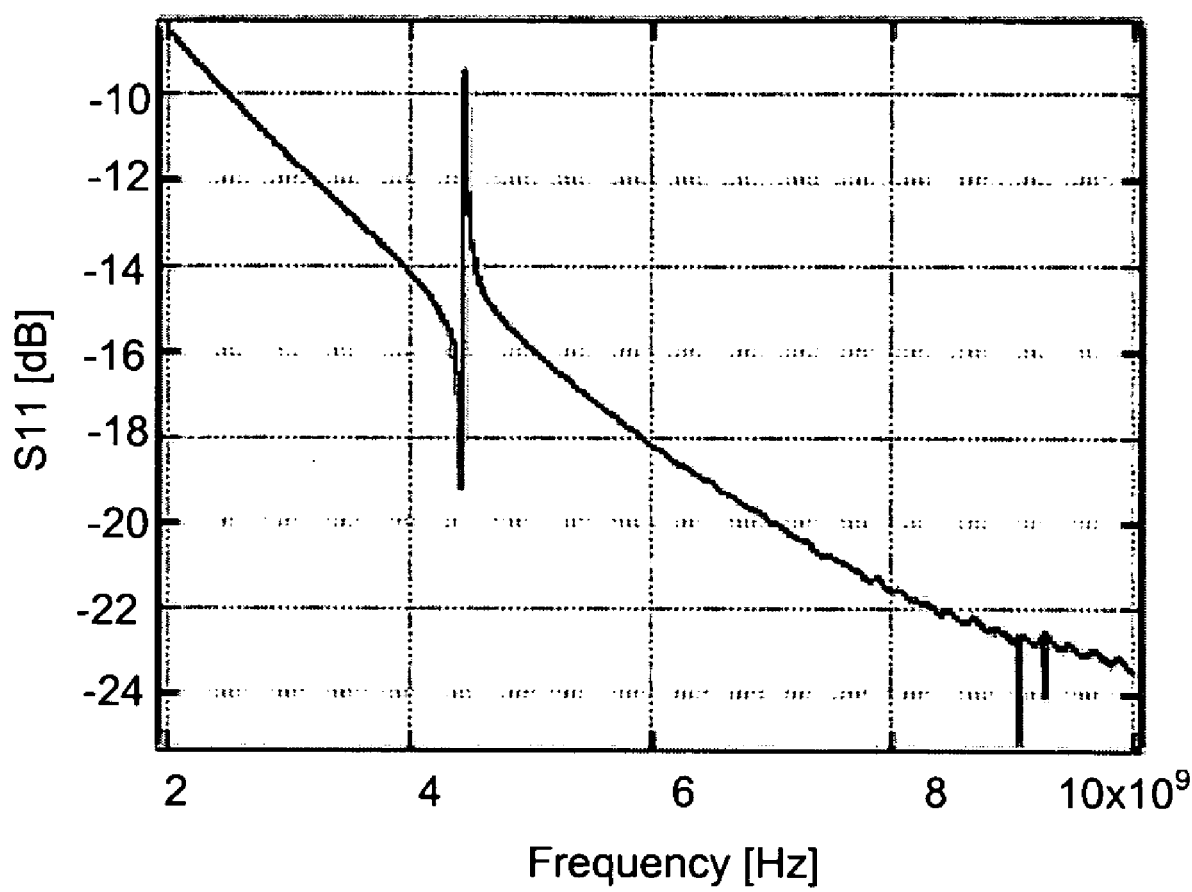

FIG. 17 is a chart that shows measured $S_{21}$ values with respect to signal frequencies for the first FBAR device embodiment described above. FIG. 18 shows measured corresponding $S_{11}$ values for the first FBAR device embodiment described above. The $S_{11}$ parameter is a measure of the reflection coefficient of a component, while the $S_{21}$ parameter is a measure of the transmission coefficient of that component. S parameters are a representation of the properties of a network. The S21 and S11 parameters are often used to describe the transmission and reflection of a certain two-port network.

CONCLUSION

Various arrangements and embodiments in accordance with the present invention have been described herein. It will be appreciated, however, that those skilled in the art will understand that changes and modifications may be made to these arrangements and embodiments, as well as combinations of the various embodiments without departing from the true scope and spirit of the present invention, which is defined by the following claims.

What is claimed is:

1. An FBAR device comprising:
a bottom electrode;
a top electrode;
a piezoelectric layer in between the bottom electrode and the top electrode, the piezoelectric layer having a first overlap with the bottom electrode, the first overlap being defined by a projection of the piezoelectric layer onto the bottom electrode in a direction substantially perpendicular to a plane of the bottom electrode;
a first dielectric layer in between the piezoelectric layer and the bottom electrode, the first dielectric layer having a first thickness; and
a mechanism for reversibly varying an internal impedance of the device, so as to tune a resonant frequency of the FBAR device.

2. The FBAR device of claim 1, wherein the piezoelectric layer is suspended on a single side and is part of a cantilever structure.

3. The FBAR device of claim 1, wherein the mechanism for reversibly varying the internal impedance of the FBAR device comprises one of a mechanism for altering relative positions of components of the FBAR device and a mechanism for moving a constituting element in the form of a solid piece or block of material having a dielectric constant greater than 1 into or out of a part of the FBAR device in which there is an electric field during operation.

4. The FBAR device of claim 1, wherein the mechanism for reversibly varying the internal impedance of the device is a mechanism for varying the first thickness of the first dielectric layer.

5. The FBAR device of claim 1, further comprising a second dielectric layer having a second thickness, the second dielectric layer being in between the piezoelectric layer and the top electrode, the piezoelectric layer having a second overlap with the top electrode, the second overlap being defined by a projection of the piezoelectric layer onto the top electrode in a direction substantially perpendicular to a plane of the top electrode.

6. The FBAR device of claim 5, wherein the mechanism for varying the internal impedance of the FBAR device comprises a mechanism for varying the second thickness of the second dielectric layer.

7. The FBAP. device of claim 1, wherein the FBAR device has a Quality factor greater than three hundred.

8. The FBAR device of claim 1, wherein the FBAR device has a tuning range between 1% and 3%.

9. The FBAR device of claim 1, wherein the bottom electrode comprises a first material and the top electrode comprises a second material, the first material and the second material being different from each other.

10. The FBAR device of claim 9, wherein the first material is a first metal and the second material is a second metal.

11. An FBAR device comprising:
a bottom electrode;
a top electrode;
a piezoelectric layer in between the bottom electrode and the top electrode, the piezoelectric layer having a first overlap with the bottom electrode, the first overlap being defined by a projection of the piezoelectric layer onto the bottom electrode in a direction substantially perpendicular to a plane of the bottom electrode, and the piezoelectric layer having a second overlap with the top electrode, the second overlap being defined by a projection of the piezoelectric layer onto the top electrode in a direction substantially perpendicular to a plane of the top electrode;
a first dielectric layer in between the piezoelectric layer and the bottom electrode, the first dielectric layer having a first thickness;
a second dielectric in between the piezoelectric layer and the top electrode, the second dielectric layer having a second thickness; and
a mechanism for reversibly varying an internal impedance of the FBAR device, so as to tune the resonant frequency of the device.

12. The FBAR device of claim 11, wherein the mechanism for varying the internal impedance of the FBAR device is one of a mechanism for altering relative positions of components of the FBAR device and a mechanism for moving a constituting element in the form of a solid piece or block of material having a dielectric constant greater than 1 into or out of a part of the FBAR device in which there is an electric field in operation.

13. The FBAR device of claim 11, wherein the mechanism for varying the internal impedance of the FBAR device is a mechanism for varying at least one of the first thickness of the first dielectric layer and the second thickness of the second dielectric layer.

14. The FBAR device of claim 11, wherein the piezoelectric layer is suspended on a single side and is part of a cantilever structure.

15. A method for tuning a resonant frequency of an FBAR device comprising a bottom electrode, a top electrode, a piezoelectric layer in between the bottom electrode and the top electrode, the piezoelectric layer having a first overlap with the bottom electrode, the first overlap being defined by a projection of the piezoelectric layer onto the bottom electrode in a direction substantially perpendicular to a plane of the bottom electrode, and a first dielectric layer in between the piezoelectric layer and the bottom electrode, the method comprising: varying an internal impedance of the FBAR device to tune the resonant frequency, wherein the tuning is reversible.

16. The method of claim 15, wherein varying the internal impedance of the FBAR device comprises one of altering relative positions of components of the device and moving a constituting element in the form of a solid piece or block of material having a dielectric constant greater than 1 into or out of a part of the device in which there is an electric field in operation.

17. The method of claim 15, wherein varying the internal impedance of the FBAR device to tune the resonant frequency comprises at least one of varying a thickness of the first dielectric layer and varying the first overlap.

18. The method of claim 17, wherein varying the first overlap comprises moving the piezoelectric layer in a direction substantially parallel with a plane of the bottom electrode.

19. The method of claim 17, wherein varying the thickness of the first dielectric layer comprises moving the top electrode in a direction substantially perpendicular to a plane of the bottom electrode.

20. The method of claim 17, wherein the FBAR device further comprises a second dielectric layer in between the piezoelectric layer and the top electrode, the piezoelectric layer having a second overlap with the top electrode, the second overlap being defined by a projection of the piezoelectric layer onto the top electrode in a direction substantially perpendicular to a plane of the top electrode, wherein varying the internal impedance of the FBAR device comprises at least one of varying the second overlap and varying a thickness of the second dielectric layer.

\* \* \* \* \*